(12) United States Patent
Masson et al.

(10) Patent No.: US 9,871,556 B2
(45) Date of Patent: Jan. 16, 2018

(54) GENERATOR OF PHASE-MODULATED UWB PULSES

(71) Applicant: COMMISSARIAT A L'ENERGIE ATOMIQUE ET AUX ENERGIES ALTERNATIVES, Paris (FR)

(72) Inventors: Gilles Masson, Renage (FR); Frédéric Hameau, Saint-Nizier du Moucherotte (FR); Laurent Ouvry, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/034,384

(22) PCT Filed: Dec. 17, 2014

(86) PCT No.: PCT/EP2014/078246
§ 371 (c)(1),
(2) Date: May 4, 2016

(87) PCT Pub. No.: WO2015/091661
PCT Pub. Date: Jun. 25, 2015

(65) Prior Publication Data
US 2016/0294440 A1 Oct. 6, 2016

(30) Foreign Application Priority Data
Dec. 18, 2013 (FR) ...................... 13 62884

(51) Int. Cl.
*H04B 1/00* (2006.01)
*H04B 1/717* (2011.01)
(Continued)

(52) U.S. Cl.
CPC ............ *H04B 1/7172* (2013.01); *H03B 5/06* (2013.01); *H03B 5/1215* (2013.01);
(Continued)

(58) Field of Classification Search
CPC .... H04B 1/717; H04B 1/7174; H04B 5/1228; H04L 27/20; H04L 27/2046
(Continued)

(56) References Cited

U.S. PATENT DOCUMENTS

2010/0177803 A1 7/2010 Raphaeli et al.
2010/0237957 A1 9/2010 Kobayashi et al.
(Continued)

FOREIGN PATENT DOCUMENTS

WO 2011/053243 A1 5/2011

OTHER PUBLICATIONS

Ju-Ching Li, "The Design of CMOS Impulse Generators for Ultra-Wideband Communication and Radar Systems," University of Texas at Arlington, Aug. 2011.
(Continued)

*Primary Examiner* — Khai Tran
(74) *Attorney, Agent, or Firm* — Baker Hostetler LLP

(57) ABSTRACT

An ultra-wideband pulse generator for radio communication with phase modulation at frequencies of multiple gigahertz comprises an oscillator formed by a pair of intersecting differential branches that have two outputs connected to an LC resonant load. The transmission of a UWB pulse is caused by the application of a supply current to the differential pair over a few nanoseconds. Two current-injecting branches are respectively connected to the outputs S and S'. The control of phase modulation consists in applying an injection current to a single branch to unbalance the differential pair at the start of the generation of the UWB pulse. Depending on the side from which the injection current is applied, the oscillation at the carrier frequency will initiate with one phase or an opposite phase.

11 Claims, 3 Drawing Sheets

(51) Int. Cl.
  *H03B 5/06* (2006.01)
  *H04L 25/03* (2006.01)
  *H03B 5/12* (2006.01)
  *H03C 3/00* (2006.01)
(52) U.S. Cl.
  CPC ......... *H03B 5/1228* (2013.01); *H03B 5/1243* (2013.01); *H03C 3/00* (2013.01); *H04B 1/7174* (2013.01); *H04L 25/03834* (2013.01)
(58) Field of Classification Search
  USPC ............. 375/130, 302, 308, 376; 331/107 R, 331/117 R
  See application file for complete search history.

(56) References Cited

U.S. PATENT DOCUMENTS

| | | | |
|---|---|---|---|
| 2012/0081155 A1* | 4/2012 | Li | H03B 19/00 327/105 |
| 2013/0163689 A1* | 6/2013 | Diao | H03C 3/00 375/279 |

OTHER PUBLICATIONS

Rui Xu et al., "Power-Efficient Switching-Based CMOS UWB Transmitters for UWB Communications and Radar Systems," IEEE Transactions on Microwave Theory and Techniques, vol. 54, No. 8, Aug. 2006, pp. 3271-3277.

Anh Tuan Phan et al., :"Energy-Efficient Low-Complexity CMOS Pulse Generator for Multiband UWB Impulse Radio," IEEE Transactions of Circuits and Systems, vol. 55, No. 11, Dec. 2008, pp. 3552-3563.

David Barras et al., "Low-Power Ultra-Wideband Wavelets Generator with Fast Start-Up Circuit," IEEE Transactions on Microwave Theory and Techniques, vol. 54, No. 5, May 2006, pp. 2138-2145.

M. Pelissier, et al., "A 112Mb/s Full Duplex Remotely-Powered Impulse-UWB RFID Transceiver for Wireless NV-Memory Applications," IEEE Journal of Solid-State Circuits, vol. 46, No. 4, Apr. 2011.

* cited by examiner 1 ns

GENERATOR OF PHASE-MODULATED UWB PULSES

CROSS-REFERENCE TO RELATED APPLICATIONS

This application is a National Stage of International patent application PCT/EP2014/078246, filed on Dec. 17, 2014, which claims priority to foreign French patent application No. FR 1362884, filed on Dec. 18, 2013, the disclosures of which are incorporated by reference in their entirety.

FIELD OF THE INVENTION

The invention relates to the field of ultra-wideband (UWB) telecommunications, and more particularly to communication by very short pulses of a carrier frequency.

BACKGROUND

By way of indication, UWB communication is regulated for frequencies that may range from 3 to 10.6 GHz and the permitted spectral templates are defined, on the one hand, by regulatory constraints (FCC in the United States, ECC in Europe, etc.) and, on the other hand, by constraints imposed by standards (IEEE 802.15.4a, IEEE802.15.6 standards, etc.) or proprietary. These constraints on spectral templates may be grouped under the term "template specification". The bandwidth is in the range of 1 GHz and the duration of the transmitted pulses is typically of a few nanoseconds. More generally, a UWB signal is defined as a signal whose passband bandwidth at −10 dB of the maximum-power spectral density is higher than 500 MHz, or alternatively whose passband bandwidth is greater than 20% of the center frequency.

By way of example, FIG. 1 shows the general shape of a 5 nanoseconds UWB pulse with a carrier frequency of 4 GHz. FIG. 2 shows the power spectral density of this pulse. This spectrum comprises a main peak at the carrier frequency and a passband bandwidth at −10 dB of around 500 MHz, but it also comprises numerous side lobes whose frequency may be close to the carrier frequency. These peaks run the risk of making the spectrum extend outside the template imposed by the specification, and it is therefore necessary to ensure that they are reduced as much as possible.

The use of fully digital transmitter architectures that allow the spectrum of the transmitted pulse to be effectively controlled in order to reduce the side lobes thereof is theoretically known, but these architectures are not readily compatible with standard integrated-circuit technologies when the aim is to operate with frequencies that are higher than 4 GHz, and even less so at frequencies of 8 GHz. These architectures synthesize a waveform in the time domain in the manner of a digital filter operating at the Nyquist frequency. The value, as well as the precision, of the coefficients of the implemented filter have a direct impact on the level of the side lobes. However, the switching times of digital circuit transistors are too high (at least 16 GHz to operate at an 8 GHz center frequency) in the most commonly used technologies and it would be necessary to use much more expensive technologies to solve the problem.

A transmitter architecture that has been proposed in order to implement UWB pulse transmitters in the band of 3 to 8 GHz is an architecture referred to as an architecture with a switched LC oscillator. It is possible to integrate this architecture in standard technologies (a MOS technology with a transistor channel of 130 nanometers for example).

A generator with a switched LC oscillator is generally constructed as shown in FIG. 3: a pair of intersecting differential branches is mounted as an oscillator; each branch comprises a transistor whose gate is connected to the output of the other branch; the outputs are made at the drain of the transistor of the branch; a load composed of an LC circuit, resonating at the carrier frequency to be transmitted, is connected between the two outputs; the differential pair is supplied with current via a switch that allows or prevents the supply of current to the pair. This switch receives a logic command for turning it on that precisely defines the duration for which the current is applied to the differential pair, hence the duration of the UWB pulse issued at the outputs.

The LC load may be composed of a variable capacitor (for regulating the frequency of oscillation) in parallel with an inductor. The inductor and the capacitor form a resonant circuit at the desired carrier frequency for the UWB pulse. A resistor may be placed in parallel with the inductor and the capacitor in order to regulate the overvoltage coefficient of the resonance. Part (or even all) of the resonance inductor may be composed of the primary of a transformer whose secondary is connected, potentially via a filter, to the transmission antenna that is to receive the UWB pulse.

For communication with frequency modulation, for example, it is possible to act upon the value of the capacitance in order to modulate the frequency from one pulse to the next. The capacitor may then be composed of a varactor diode or equivalent; the capacitance varies depending on a bias voltage applied to the diode and the bias voltage and oscillation frequency vary as a result. It may also be composed of an array of capacitors and selector switches.

For communication with amplitude modulation, it is possible to act upon the value of the supply current of the differential pair. This value defines the peak of the variation envelope of the signal level during the pulse. By modulating the value of the supply current from one pulse to the next, the transmitted pulse is modulated in amplitude and this modulation may be detected in a detector.

However, this type of pulse generator does not allow the phase to be modulated easily as the instant of initiation of the oscillations is random, this type of oscillator initiating naturally due to noise.

The following documents describe UWB pulse generators:

Raphaeli, et al., Ultra Wideband On-Chip Pulse Generator. Patent application U.S. 2010/0177803 A1, July 2010.

Anh Tuan Phan, et al., Energy-Efficient Low-Complexity CMOS Pulse Generator for Multiband UWB Impulse Radio. IEEE TRANSACTIONS ON CIRCUITS AND SYSTEMS, Vol. 55, No. 11, December 2008.

Barras, et al., Low-Power Ultra-Wideband Wavelets Generator With Fast Start-Up Circuit. IEEE TRANSACTIONS ON MICROWAVE THEORY AND TECHNIQUES, Vol. 54, No. 5, May 2006.

Pelissier, et al., A 112 Mb/s Full Duplex Remotely-Powered Impulse-UWB RFID Transceiver For Wireless NV-Memory Applications. IEEE JOURNAL OF SOLID-STATE CIRCUITS, Vol. 46, No. 4, April 2011.

The document WO 2011/053243 describes a UWB pulse generator comprising: an oscillator formed by a pair of intersecting differential branches that have two outputs connected to an LC resonant load, the differential branches being supplied with power by a common current that is controlled by a current-switching circuit allowing a current to pass through only for a duration that is equal to a duration of a pulse to be transmitted; two current-injecting branches that are respectively connected to the two outputs; and a phase control circuit that imposes a different injection of current into the two outputs only for a part of the pulse duration.

SUMMARY OF THE INVENTION

An aim of the invention is to produce a UWB pulse generator that is capable of implementing, in a very simple manner, binary phase-shift keying without preventing the addition to the generator, if desired, of means for controlling the spectrum of the transmitted pulse by controlling the supply current of the switched LC oscillator. Advantageously, the invention additionally aims to ensure the initiation of the oscillation with an appropriate phase, while limiting the injected current.

The UWB pulse generator according to the invention therefore comprises an oscillator formed by a pair of intersecting differential branches that have two outputs connected to an LC resonant load, the differential branches being supplied with power by a common current that is controlled by a current-switching circuit allowing a current to pass through only for a duration that is equal to a duration of a pulse to be transmitted, characterized in that it additionally comprises two current-injecting branches that are respectively connected to the two outputs, and a phase control circuit that imposes a different injection of current into the two outputs before the start and at least for a first part of the pulse duration.

"Current-injecting branch" is understood to be a circuit that forces a current to flow into the inductor of the resonant circuit from one of the two outputs, even though the differential branches are normally not yet supplied by the common current. The current injected from one side rather than the other flows through the inductor in one direction or the other; it unbalances the differential pair and favors one direction of initiation of the oscillation.

The difference in injection currents is most simply obtained by injecting a current into one of the differential branches, but not into the other. The re-establishment of symmetry after the first part of the duration is most simply obtained by suspending any injection of current into the two branches. In practice, the differential branches each comprise a transistor and the gate voltages of the transistors are unbalanced by the injection of different currents into the two outputs.

Thus, at the start of the pulse, the differential branches are unbalanced due to the injection current that is drawn from one of the outputs, and an oscillation initiation phase is defined as a function of the direction of this imbalance. Two opposite phases are possible depending on the direction of the imbalance, since either one or the other of the differential branches becomes conductive first when the current-switching circuit allows a current to flow through the pair of differential branches.

The group of two injecting branches preferably comprises an injection current source that is common to both branches, and a respective phase selection transistor in each branch in order to allow or prevent the flow of a current into the corresponding branch. This transistor is connected between the output of a differential branch and the current injection source.

The phase control circuit that controls these transistors receives a timing signal that defines the instants corresponding to the start and the end of the injection of current. This signal is periodic and its period is the transmission period of the UWB pulses. The phase control circuit also receives a phase selection signal that defines, for each period, the phase (0 or 180°) of the carrier of the pulse to be transmitted. This control circuit provides control signals to the gates of the transistors of the injecting branches in order to turn one or the other of these transistors on for the first part of the duration of the pulse and to block them both after this first part.

Preferably, the current-switching circuit is a circuit comprising multiple current sources and associated switches and it is capable of successively setting up multiple different current values from the start of the pulse and up to the end so as to give a chosen profile to the amplitude envelope of the oscillation signal that is present at the outputs of the differential pair for the duration of the pulse.

The LC resonant load preferably comprises, or may even be solely composed of, the primary of a transformer whose secondary is connected, potentially via a filter, to a transmission antenna.

Additionally, the load preferably comprises a capacitor whose value is electronically controllable, according to a desired carrier frequency for the UWB pulse to be transmitted.

BRIEF DESCRIPTION OF THE DRAWINGS

Other characteristics and advantages of the invention will become apparent upon reading the detailed description which follows, given with reference to the appended drawings in which.

DETAILED DESCRIPTION

Figure 1:
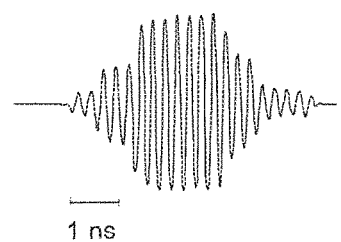
FIG. 1, already described, shows a UWB pulse with a carrier frequency of 4 GHz, with a duration of around 5 nanoseconds.
Figure 2:
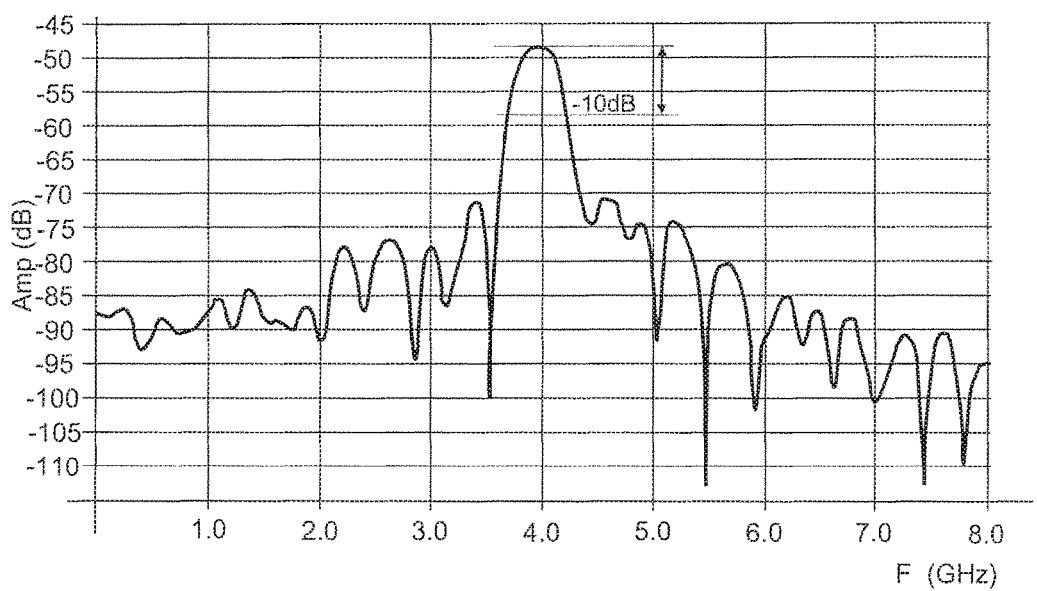
FIG. 2, already described, shows the spectrum of this pulse, with a passband bandwidth at −10 dB of around 500 MHz.
Figure 3:
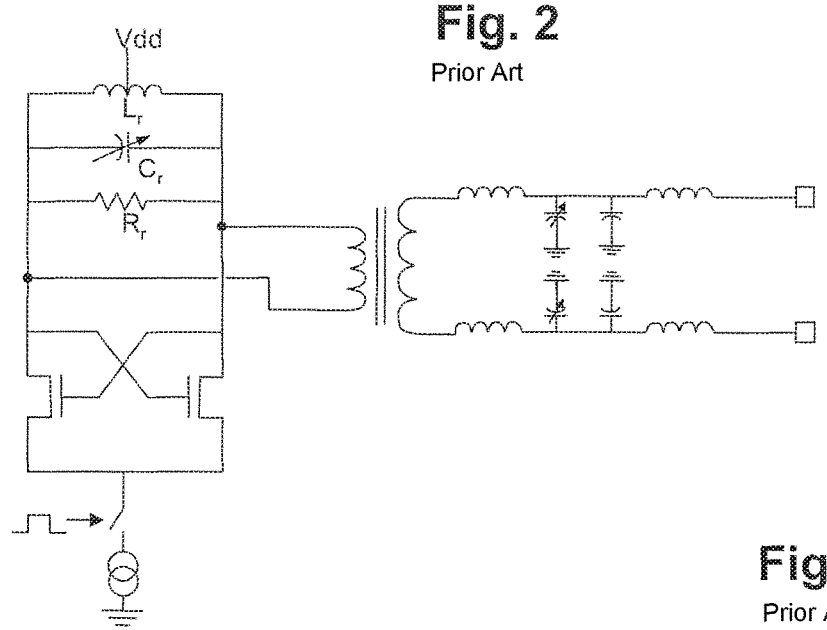
FIG. 3, already described, shows the principle of a pulse generator with a switched LC oscillator.
Figure 4:
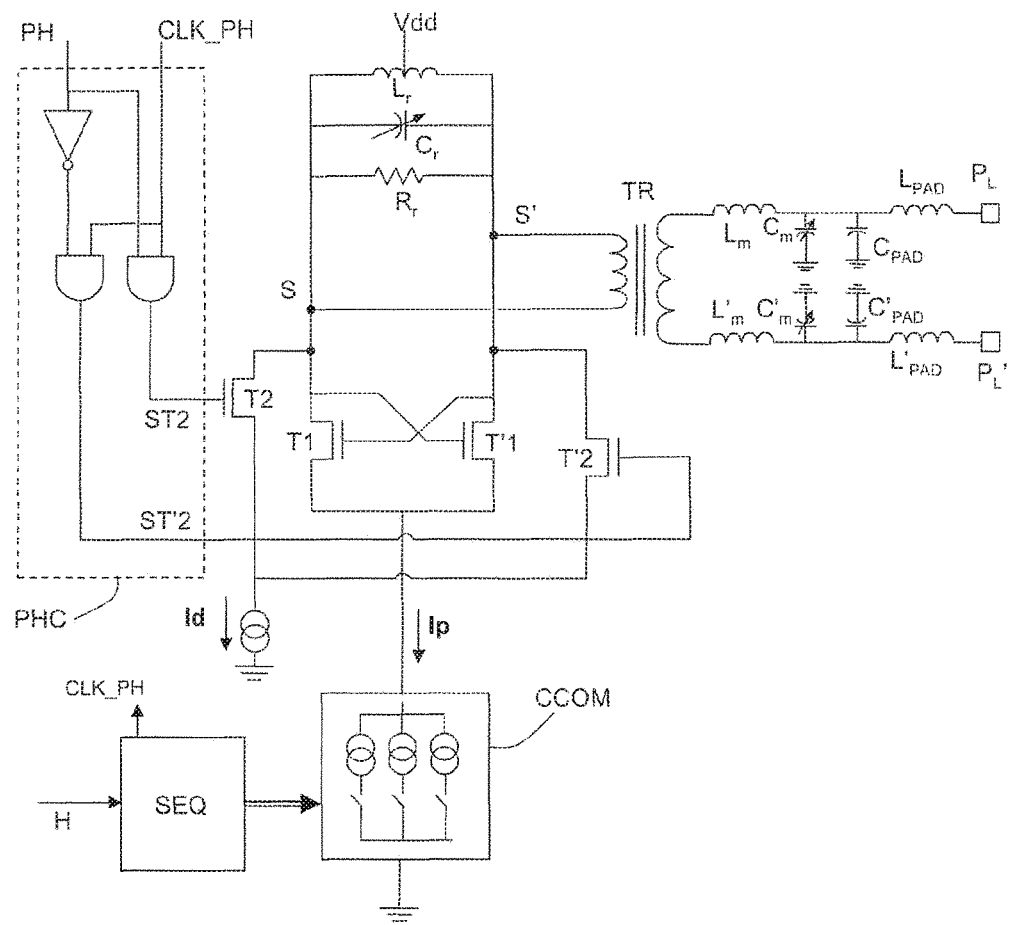
FIG. 4 shows an exemplary embodiment of the generator according to the invention.

The UWB pulse generator of FIG. 4 comprises a pair of two balanced differential branches that are supplied with power by, at one end, a supply voltage source Vdd and, on the other end, by a common current Ip. This common current is present during the UWB pulse as it is the presence of this current that allows the transmission of the pulse. It is absent outside the pulse. A general sequencer SEQ, controlled by a general clock H, sets up the control signals of the switching circuit that turns the current Ip on with a period Tp that may be defined by a clock signal inside the sequencer SEQ.

The differential branches each comprise a transistor, T1 for the first branch, T'1 for the second branch. A load is inserted between the drain of the transistor and the supply voltage source Vdd. This load is an LC circuit resonating at the carrier frequency $F_0$ of the UWB pulse to be transmitted. In the example shown, the load is shared between the branches; it comprises an inductor $L_r$ and a capacitor $C_r$ in parallel, as well as a damping resistor $R_r$ that may be the intrinsic internal resistance of the inductor. These elements in parallel are connected between the output S of the first branch and the output S' of the second branch. The outputs S and S' may be made at the drains of the respective transistors T1 and T'1 of the first and the second branch.

The supply voltage source is preferably connected, as is the case in FIG. 4, to a center tap on the loading inductor $L_r$ in order to ensure that the oscillator receives a continuous supply.

The UWB pulse is generated between the outputs S and S'. These outputs are therefore connected to a load that makes use of the UWB pulse. If the aim is to transmit the pulse using an antenna, then the outputs are connected to a transmission circuit that is itself connected to the antenna.

In the example shown, the transmission circuit comprises:

a transformer TR whose primary winding is connected between the outputs S and S';

and an impedance-matching circuit that is connected on one side to the secondary of the transformer, and on the other side to two external connection pads $P_L$ and $P'_L$ for the integrated circuit in which the pulse generator is implemented.

The impedance-matching circuit may comprise two (in principle identical) inductors Lm and L'm and two (in principle identical) capacitors Cm and C'm; the values of these impedances take into account the intrinsic impedances of the external connection pads and connections connected to these pads. The intrinsic impedances of the pads and connections have been represented in the form of (in principle identical) inductors $L_{PAD}$ and $L'_{PAD}$ and (in principle identical) capacitors $C_{PAD}$, $C'_{PAD}$. The set of inductors $L_m$, $L'_m$, $L_{PAD}$, $L'_{PAD}$, $C_m$, $C'_m$, $C_{PAD}$, $C'_{PAD}$ forms the matching circuit between the transformer and the output of the integrated circuit.

The loading inductor $L_r$ of the resonant circuit does not have to be present if the inductance on the side of the primary of the transformer has a value that is sufficient to fulfill the role of the inductor $L_r$ in the LC resonant circuit. Of course, provision must then be made for the continuous voltage supply source Vdd to be connected to a center tap on the primary of the transformer in order to be able to supply the voltage Vdd symmetrically to both differential branches.

The UWB pulses are transmitted in a time slot of duration T, during which the common current source of value Ip is turned on. They stop when the current stops. A switching circuit CCOM, comprising at least one current source in order to set up the value Ip and a switch for turning the current source on or off, is placed in series between the junction point of the differential branches (i.e. the transmitters together with the transistors T1 and T'1) and a ground at a reference potential of 0. The switching circuit is controlled by the general sequencer SEQ.

The circuit oscillates at the resonant frequency $F_0$ of the load of the differential pair when a current Ip is applied to this differential pair, hence for the duration T.

The pulses may be periodically transmitted with a period Tp. The durations T and Tp are defined by the sequencer based on the clock H.

A phase-forcing circuit is provided in order to impose an initiation phase on the oscillation of the differential pair, hence a phase of the carrier frequency of the UWB pulse. This circuit comprises two current-injecting branches, of which one is connected to the output S and the other to the output S', and a phase control circuit PHC for controlling these branches according to a desired phase out of two possible opposite phases that will arbitrarily be denoted by 0° phase and 180° phase.

The group of two injecting branches comprises an injection current source common to both branches that are connected at their base; the injecting branches each comprise a respective phase selection transistor T2, T'2; the injection current source draws a current Id from the two injecting branches that are connected at their base by the emitters of these two transistors. The transistors T2 and T'2 are not on at the same time, so that the current Id is injected either into the output S or into the output S' depending on whether the transistor T2 or the transistor T'2 has been turned on. The transistors T2 and T'2 may be simultaneously blocked when no current is to be injected into either the output S or the output S'. The injected current (−Id) flows into the inductor of the LC resonant circuit.

According to the desired phase upon initiation of the UWB pulse, the transistor T2 or the transistor T'2 is turned on from the start of the duration T or even a bit before the start of the duration T; then this transistor remains on for a first part of the duration T, and finally it may be blocked once again for the rest of the duration T and after the end of the duration T. The current Id of the injection source is much smaller than the value of the current Ip that generates the UWB pulse. In order to minimize consumption, provision is made for the current Id to be preferably at least 20 times smaller than the value of Ip or than the value of the maximum of Ip if Ip varies over the course of the UWB pulse. This value is sufficient to initially create a controlled imbalance of the differential pair T1, T'1. If the current Id is very small, provision may even be made for it to remain present throughout the duration of the pulse and beyond. If it is larger, it is preferable to interrupt it for a second part of the pulse duration that is subsequent to the first part.

If it is the transistor T2 that is on for the first part of the duration T, it is the transistor T1 that tends to conduct initially upon initiation of the oscillation. If, on the other hand, it is the transistor T'2 that is on for the first part of the duration T, it is the transistor T1, rather than the transistor T1, that tends to conduct initially upon initiation of the oscillation. The initiation phase will therefore be inverted depending on the side from which a current (−Id) is injected. This initial phase is subsequently maintained throughout the UWB pulse, even if there are no more injections of current after the start of the pulse.

The phase control circuit PHC therefore initially sets up a control signal for turning the transistor on ST2 at the gate of the transistor T2 or a control signal ST'2 at the gate of the transistor T'2 depending on the desired phase.

The control signal ST2 and the control signal ST'2 begin at the start or just before the start of the duration T, from which point a current Ip is set up. It extends from the start of the duration T up to an intermediate instant between the start and the end of the duration T. These signals ST2 and ST'2 are set up on the basis of a periodic timing signal CLK_PH that is issued by the sequencer SEQ. The signal CLK_PH is a logic signal that defines, in each period, the start and the end of the application of an injection current; this signal is applied to two AND gates of which one receives a logic signal PH for selecting the phase and the other the inverse PH_B of this signal PH via an inverter. The outputs of the AND gates provide the signals ST2 and ST'2 that are applied to the gates of the transistors T2 and T'2.

The phase control circuit therefore comprises only a very small number of components and the timing precision of phase control is therefore very high: the timing error that may be established between the two opposite phases is due only to the disparity in transit time that may exist in this circuit as a result of the two AND gates. It may be assumed that this disparity remains below one picosecond. If operating at 8 GHz, namely with a carrier with a period of 62.5 picoseconds, the timing error remains negligible, while a greater timing disparity would have negative consequences on the spectrum of the pulse; it is therefore an advantage of this architecture that almost all disparities are eliminated.

Figure 5:
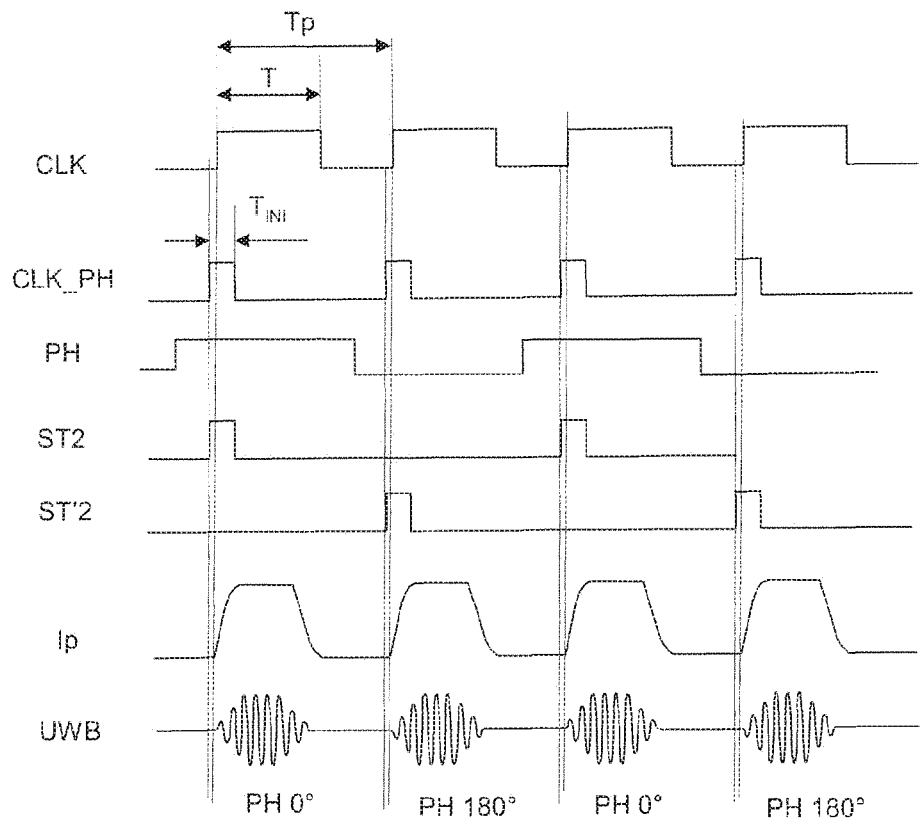
FIG. 5 shows an operating timing diagram of the generator during the transmission of UWB pulses that are phase modulated in a binary manner.

The timing diagram of FIG. 5 shows the phase control signals and the UWB pulse generated, in a simple case in which the phase is inverted upon each new UWB pulse:

a signal CLK, representing the transmission periodicity of the UWB pulses; CLK is shown in the form of periodic slots of duration T and of period Tp, corresponding to the desired rate of transmission of the UWB pulses;

a timing signal CLK_PH of the same period Tp and whose duration $T_{INI}$ defines the duration for which the signals ST2 or ST'2 must be applied during the initialization of the oscillation; the duration $T_{INI}$ is preferably, but not necessarily, shorter or even much shorter than the duration T of the UWB pulses; it starts before the instant corresponding to the transmission of the UWB pulse, i.e. before the application of a supply current Ip to the differential pair;

a phase selection signal PH: here, in the example shown in FIG. 5, a signal that alternates upon each period Tp, hence upon each UWB pulse, between two opposite phases;

a signal ST2 that is generated by one of the AND gates for only one of the phases;

a signal ST'2 that is generated by the other AND gate for the other phase;

a current Ip that is applied to the differential pair (in the case of a current Ip set up in a single increment) for a duration T and with a period Tp;

a UWB pulse with a phase that alternates in agreement with the alternating phase control PH.

Given that controlling the spectrum of the UWB pulse is important for maintaining this spectrum within the template imposed by the template specification, provision is preferably made for the amplitude of the current Ip not to be constant for the duration T, but to be set up according to successive increments between the zero value and a maximum value and subsequently reduced by successive increments between the maximum value and the zero value. For this purpose, provision is made for the current-switching circuit CCOM to comprise multiple current sources in parallel, and switches that are actuated according to a very precise sequence within the duration T, in order to successively turn on a current that incrementally increases and then incrementally decreases.

Figure 6:
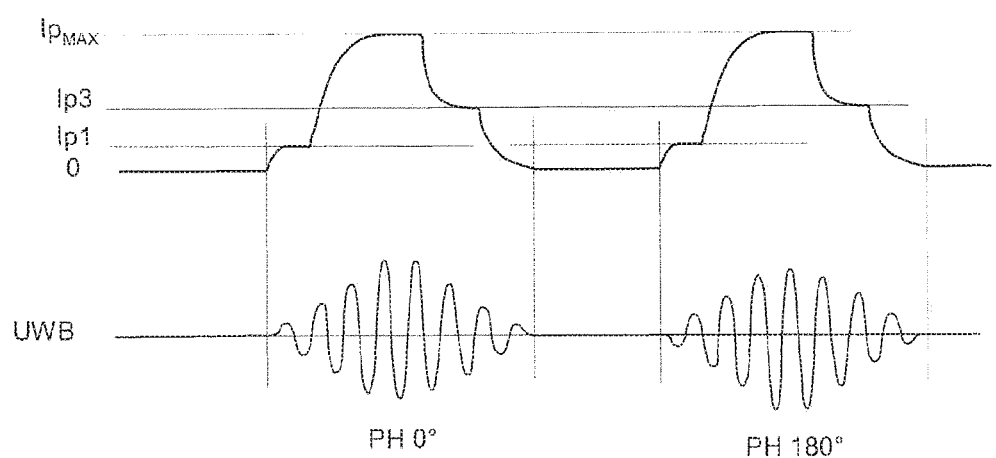
FIG. 6 shows the appearance of the current in the pair of differential branches in the case in which this current is modulated in amplitude during the pulse, for improved control of the spectrum.

An exemplary current-switching sequence with four values is given in FIG. 6, in which the current incrementally increases from a value 0 to a value Ip1, then to a value $Ip_{MAX}$ that is higher than Ip1, then decreases to a value Ip3 (which could be equal to Ip1) and returns to zero.

The various currents may be generated by current sources with different Ip1, $Ip_{MAX}$, Ip3 values, and/or by placing multiple current sources in parallel whose sums allow the desired values to be obtained.

In comparison to the architectures of the prior art, three advantages may be noted that allow the phase error that would be caused by the technological mismatches to be reduced:

the current that is injected in order to create the imbalance that imposes the phase is exactly identical for the two opposite phases: it is the current Id that is shunted from one side or the other but which does not change in value;

the current for controlling the initiation phase may be very small, 10 microamps for example, as it is independent of the main current Ip that generates the oscillation; the phase selection transistors T2 and T'2 are then of small size, thereby leading to a low impact from their possible mismatching;

the control edge for choosing the phase is identical for both phases; it is derived from the rising edge of the signal CLK_PH; the selection of the injecting branch is implemented symmetrically in both AND gates before the transit of this control edge; consequently, the only technological mismatch remaining is the mismatch in the time it takes for the edge to cross the AND gates, this may be estimated to be 2% of the crossing time, namely 0.8 picoseconds for a crossing time of 40 picoseconds, which is low, for example, in relation to a specification that tolerates a matching error of 5% with respect to the period of the carrier frequency (8 GHz).

The invention claimed is:

1. An Ultra-Wide Band (UWB) pulse generator comprising:
    an oscillator formed by a pair of intersecting differential branches that have two outputs connected to an Inductance-Capacitance (LC) resonant load, the differential branches being supplied with power by a common current that is controlled by a current-switching circuit allowing a current to pass through only for a duration that is equal to a duration of a pulse to be transmitted;
    two current-injecting branches that are respectively connected to the two outputs; and
    a phase control circuit that imposes a different injection of direct current into the two outputs;
    wherein said phase control circuit is configured so as to impose said injection of direct current before a start and at least for a first part of the pulse duration.

2. The UWB pulse generator of claim 1, wherein the injection of current into the two outputs is zero after an end of the first part of the pulse duration.

3. The UWB pulse generator of claim 1, wherein the two injecting branches comprise an injection current source that is common to both branches and a respective phase selection transistor in each branch between the output of a differential branch and the injection current source.

4. The UWB pulse generator of claim 3, wherein the phase control circuit receives a timing signal that defines instants corresponding to the start and an end of the injection of current, with a period that is a transmission period of UWB pulses, and a phase selection signal, and the phase control circuit provides control signals to the transistors of the injecting branches in order to turn one or the other of these transistors on for the first part of the duration of the pulse and to simultaneously block them after an end of this first part.

5. The UWB pulse generator of claim 1, wherein the current-switching circuit is a circuit comprising multiple current sources and associated switches and is arranged in order to successively set up multiple different current values from the start of the pulse and up to the end so as to give a chosen profile to an amplitude envelope of a signal that is present at the outputs of the differential pair for the duration of the pulse.

6. The UWB pulse generator of claim 1, wherein the LC resonant load comprises a primary of a transformer whose secondary is connected, potentially via a filter, to a transmission antenna.

7. The UWB pulse generator of claim 1, wherein the LC resonant load comprises a capacitor whose value is electronically controllable, according to a desired carrier frequency for the UWB pulse to be transmitted.

8. An Ultra-Wide Band (UWB) pulse generator comprising:
- an oscillator formed by a pair of intersecting differential branches that have two outputs connected to an Inductance-Capacitance (LC) resonant load, the differential branches being supplied with power by a common current that is controlled by a current-switching circuit allowing a current to pass through only for a duration that is equal to a duration of a pulse to be transmitted;
- two current-injecting branches that are respectively connected to the two outputs; and
- a phase control circuit that imposes a different injection of direct current into the two outputs;
- wherein said phase control circuit is configured so as to impose said injection of direct current before a start and at least for a first part of the pulse duration; and
- wherein the injection of current into the two outputs is zero after an end of the first part of the pulse duration.

9. An Ultra-Wide Band (UWB) pulse generator comprising:
- an oscillator formed by a pair of intersecting differential branches that have two outputs connected to an Inductance-Capacitance (LC) resonant load, the differential branches being supplied with power by a common current that is controlled by a current-switching circuit allowing a current to pass through only for a duration that is equal to a duration of a pulse to be transmitted;
- two current-injecting branches that are respectively connected to the two outputs; and
- a phase control circuit that imposes a different injection of direct current into the two outputs;
- wherein said phase control circuit is configured so as to impose said injection of direct current before a start and at least for a first part of the pulse duration; and
- wherein the current-switching circuit is a circuit comprising multiple current sources and associated switches and is arranged in order to successively set up multiple different current values from the start of the pulse and up to the end so as to give a chosen profile to an amplitude envelope of a signal that is present at the outputs of the differential pair for the duration of the pulse.

10. An Ultra-Wide Band (UWB) pulse generator comprising:
- an oscillator formed by a pair of intersecting differential branches that have two outputs connected to an Inductance-Capacitance (LC) resonant load, the differential branches being supplied with power by a common current that is controlled by a current-switching circuit allowing a current to pass through only for a duration that is equal to a duration of a pulse to be transmitted;
- two current-injecting branches that are respectively connected to the two outputs; and
- a phase control circuit that imposes a different injection of direct current into the two outputs;
- wherein said phase control circuit is configured so as to impose said injection of direct current before a start and at least for a first part of the pulse duration;
- wherein the two injecting branches comprise an injection current source that is common to both branches and a respective phase selection transistor in each branch between the output of a differential branch and the injection current source.

11. The UWB pulse generator of claim 10, wherein the phase control circuit receives a timing signal that defines instants corresponding to the start and an end of the injection of current, with a period that is a transmission period of UWB pulses, and a phase selection signal, and the phase control circuit provides control signals to the transistors of the injecting branches in order to turn one or the other of these transistors on for the first part of the duration of the pulse and to simultaneously block them after an end of this first part.

* * * * *